(12) United States Patent
Elkanovich et al.

(10) Patent No.: US 11,699,683 B2
(45) Date of Patent: Jul. 11, 2023

(54) SEMICONDUCTOR DEVICE IN 3D STACK WITH COMMUNICATION INTERFACE AND MANAGING METHOD THEREOF

(71) Applicants: Global Unichip Corporation, Hsinchu (TW); Taiwan Semiconductor Manufacturing Company, Ltd., Hsinchu (TW)

(72) Inventors: Igor Elkanovich, Hsinchu (TW); Amnon Parnass, Hsinchu (TW); Pei Yu, Hsinchu (TW); Li-Ken Yeh, Hsinchu (TW); Yung-Sheng Fang, Hsinchu (TW); Sheng-Wei Lin, Hsinchu (TW); Tze-Chiang Huang, Hsinchu (TW); King Ho Tam, Hsinchu (TW); Ching-Fang Chen, Hsinchu (TW)

(73) Assignees: Global Unichip Corporation, Hsinchu (TW); Taiwan Semiconductor Manufacturing Company, Ltd., Hsinchu (TW)

(*) Notice: Subject to any disclaimer, the term of this patent is extended or adjusted under 35 U.S.C. 154(b) by 399 days.

(21) Appl. No.: 17/037,753

(22) Filed: Sep. 30, 2020

(65) Prior Publication Data
US 2022/0059501 A1 Feb. 24, 2022

Related U.S. Application Data

(63) Continuation-in-part of application No. 16/999,055, filed on Aug. 20, 2020.

(51) Int. Cl.
*H01L 25/065* (2023.01)
*H04L 69/08* (2022.01)
(Continued)

(52) U.S. Cl.
CPC ........ *H01L 25/0657* (2013.01); *G06F 13/409* (2013.01); *G06F 13/4068* (2013.01);
(Continued)

(58) Field of Classification Search
CPC ..... H01L 25/0657; H01L 12/66; H01L 69/08; H01L 2224/16145
See application file for complete search history.

(56) References Cited

U.S. PATENT DOCUMENTS 6,049,894 A    4/2000   Gates
6,670,882 B1 * 12/2003   Bachar .................. H04L 12/403
                                                                      340/3.5
(Continued)

OTHER PUBLICATIONS

"Notice of Allowance of Related U.S. Appl. No. 17/037,739", dated Apr. 5, 2021, pp. 1-11.
(Continued)

*Primary Examiner* — Henry Tsai
*Assistant Examiner* — Aurangzeb Hassan
(74) *Attorney, Agent, or Firm* — JCIPRNET

(57) ABSTRACT

A semiconductor device with an interface includes a master device and a plurality of slave devices. The master device includes a master interface. The slave devices are stacked on the master device one after one as a three-dimension (3D) stack. Each of the slave devices includes a slave interface and a managing circuit, the master interface and the slave interfaces form the interface for passing signals in communication between the master device and the slave devices. The managing circuit of a current one of the slave devices drives a next one of the slave devices. An operation command received at the current one of the slave devices is just passed to the next one of the slave devices through the interface. A response from the current one of the slave devices is passed back to the master device through the interface.

16 Claims, 9 Drawing Sheets

(51) Int. Cl.
*G06F 13/40* (2006.01)
*H04L 12/66* (2006.01)

(52) U.S. Cl.
CPC .............. *H04L 12/66* (2013.01); *H04L 69/08* (2013.01); *H01L 2224/16145* (2013.01)

(56) References Cited

U.S. PATENT DOCUMENTS

| | | | |
|---|---|---|---|
| 9,389,953 | B2 | 7/2016 | Choi et al. |
| 9,530,442 | B1 | 12/2016 | Hassner et al. |
| 10,592,448 | B2 | 3/2020 | Chang |
| 10,606,778 | B2* | 3/2020 | Chiu .................... G06F 13/4068 |
| 10,708,080 | B2* | 7/2020 | Huber ..................... H04L 12/40 |
| 10,877,909 | B2* | 12/2020 | Lee ........................ G06F 3/0679 |
| 2008/0147964 | A1 | 6/2008 | Chow et al. |
| 2012/0007624 | A1* | 1/2012 | Byeon ................. G11C 11/4076 |
| | | | 324/750.15 |
| 2012/0154008 | A1* | 6/2012 | Kim .................... G06F 13/4247 |
| | | | 327/202 |
| 2017/0083468 | A1* | 3/2017 | Sengoku ............. H04L 61/5092 |
| 2019/0213164 | A1 | 7/2019 | Kwon et al. |
| 2019/0347159 | A1 | 11/2019 | Chang et al. |
| 2020/0073833 | A1* | 3/2020 | Graif ........................ G06F 13/24 |
| 2020/0076713 | A1* | 3/2020 | Meyer ..................... H04L 43/06 |
| 2022/0038305 | A1* | 2/2022 | Vivar ................... G06F 13/4247 |
| 2022/0274502 | A1* | 9/2022 | Ah .......................... B60L 53/67 |

OTHER PUBLICATIONS

"Office Action of Taiwan Related Application, application No. 109142753", dated Mar. 31, 2021, p. 1-p. 4.

\* cited by examiner

SEMICONDUCTOR DEVICE IN 3D STACK WITH COMMUNICATION INTERFACE AND MANAGING METHOD THEREOF

CROSS-REFERENCE TO RELATED APPLICATION

This application is a continuation-in-part application of and claims priority benefit of U.S. application Ser. No. 16/999,055, filed on Aug. 20, 2020, now pending. The entirety of the above-mentioned patent application is hereby incorporated by reference herein and made a part of this specification.

BACKGROUND

Technical Field

The invention is related to fabrication of semiconductor device and more particularly to a semiconductor device in three-dimension (3D) stack with communication interface and managing method for the semiconductor device.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 3D semiconductor device, in which several circuit chips may be stacked up and integrated as a larger integrated circuit, in which the bonds and the through-silicon via (TSV) are used to connect between the chips.

The packaging technology in system-on-integrated-chips (SoIC) package and wafer-on-wafer (WoW) package, and chip-on-wafer-on-substrate (CoWoS) have been proposed to package multiple chips as stacked up in height.

However, the communication between the master chip and multiple slave chips as the 3D stack is still under development to have better performance with a compact structure. Further, the bond patterns between two chips need to be arranged to be easily connected to adapt the 3D stack of multiple chips. Further, since multiple slave chips are staked over the master device, how to address the slave chips in the initialization stage and the manage the slave device to recognize the address as requested by the master chip may be developed in a better efficient way.

SUMMARY

The invention provides a semiconductor device in 3D stack with communication interface and managing method for the semiconductor device. The slave chips may be easily set with address and the target address as requested by the master chip may be recognized for one slave chip after one slave chip. The total number of slave chips to be driven may increase.

In an embodiment, the invention provides a semiconductor device with an interface including a master device and a plurality of slave devices. The master device includes a master interface. The slave devices are stacked on the master device one after one as a three-dimension (3D) stack. Each of the slave devices includes a slave interface and a managing circuit, the master interface and the slave interfaces form the interface for passing signals in communication between the master device and the slave devices. The managing circuit of a current one of the slave devices drives a next one of the slave devices. An operation command received at the current one of the slave devices is just passed to the next one of the slave devices through the interface. A response from the current one of the slave devices is passed back to the master device through the interface.

In an embodiment, the invention provides a managing method of a semiconductor device with an interface. The semiconductor device including a master device and a plurality of slave devices stacked on the master device one after one as a three-dimension (3D) stack. The managing method includes: configuring the master device to have a master interface; and configuring each of the slave devices to have a slave interface and a managing circuit. The master interface and the slave interfaces form the interface for passing signals in communication between the master device and the slave device. The managing circuit of a current one of the slave devices drives a next one of the slave devices. An operation command received at the current one of the slave devices is just passed to the next one of the slave devices through the interface. A response from the current one of the slave devices is passed back to the master device through the interface.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention is directed to an interface for a 3D semiconductor device, in which the interface is also fabricated based on the 3D packaging technology. The interface may link single master chip such as processor with multiple slave chips such as static random access memory (SRAM).

In addition, the slave chip may include a managing circuit to address the slave chip in an initialization stage one slave chip after one slave chip. In addition, the response may be passed back to the master device. The address signals may need not to be sent to all the slave chips on at the same time. Instead, the address signals as issued from the master chip may passed one slave chip after one slave chip. The number of slave chips may be more without limiting to the driving capability of the master chip to a limited number of the slave chips as stacked.

To have communication between the master chip and the multiple slave chips in the 3D stack, the interface is first proposed. The managing mechanism to the slave chips may be based on the interface as set up. In an embodiment, the interface of the invention for passing the communication signals is described first.

In the invention the interface allows the communication between the master chip and the multiple slave chips. The communication signals may include the command from the master chip and the responding information from the one of the slave chips as selected. The interface provides a reliable communication. In addition, the signal latency between the master chip and each of the slave chips may be stable as about a constant and predictable. Due to the control of the latency, the trigger edge of the effective clock may be properly set corresponding to the data packet, which may also be referred as a data eye.

Several embodiments are provided for describing the invention but the invention is not just limited to the embodiments.

Figure 1:
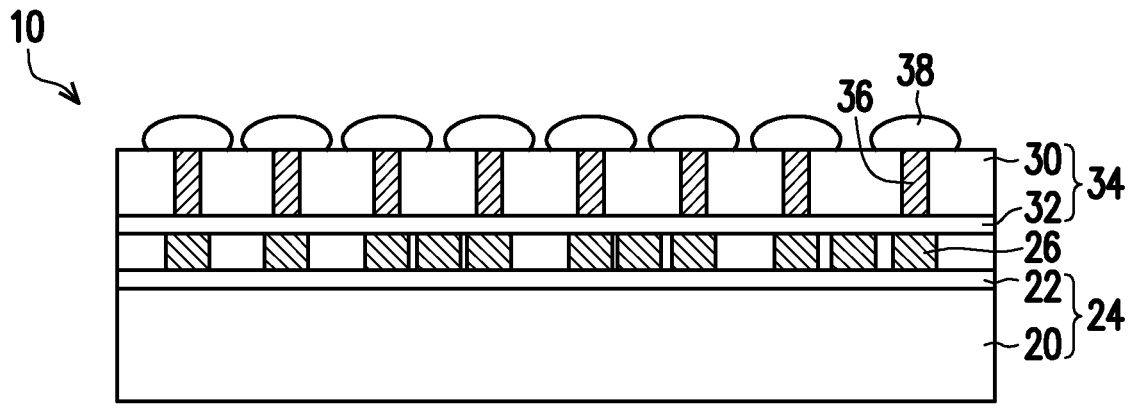
FIG. 1 is a drawing, schematically illustrating a cross-sectional stack structure of 3D semiconductor device, according to an embodiment of the invention.

FIG. 1 is a drawing, schematically illustrating a structure of 3D semiconductor device in cross-sectional view, according to an embodiment of the invention. Referring to FIG. 1, a 3D semiconductor device 10 includes multiple chips 24, 34, which are vertically stacked up in addition to the horizontal distribution of the chips. As a result, the 3D semiconductor device including the chips is formed.

In an example, a circuit chip 24 may be treated as a master chip, which generally includes the substrate 20 and the circuit layer 22. Several other circuit chips 34, such as serving as the slave chips, are to be stacked over the circuit chip 24, in which the through via structures, such as TSV structure 26 with bonds, based on the packaging process may be formed between the circuit chip 24 and the circuit chips 34. The circuit chip 34 includes the substrate 30 and the circuit layer 32 and may further include the TSV structures 36 at the corresponding locations to electrically connect to the circuit chip 24. In addition, the bonds 38 may also be formed at the most outer surface corresponding to the TSV structures 36.

The 3D packaging technology has been proposed in various stack structure, such as system-on-integrated-chips (SoIC) package, wafer-on-wafer (WoW) package, and chip-on-wafer-on-substrate (CoWoS). The invention is based on the 3D packaging but not limited to the types of the 3D packaging.

Figure 2:
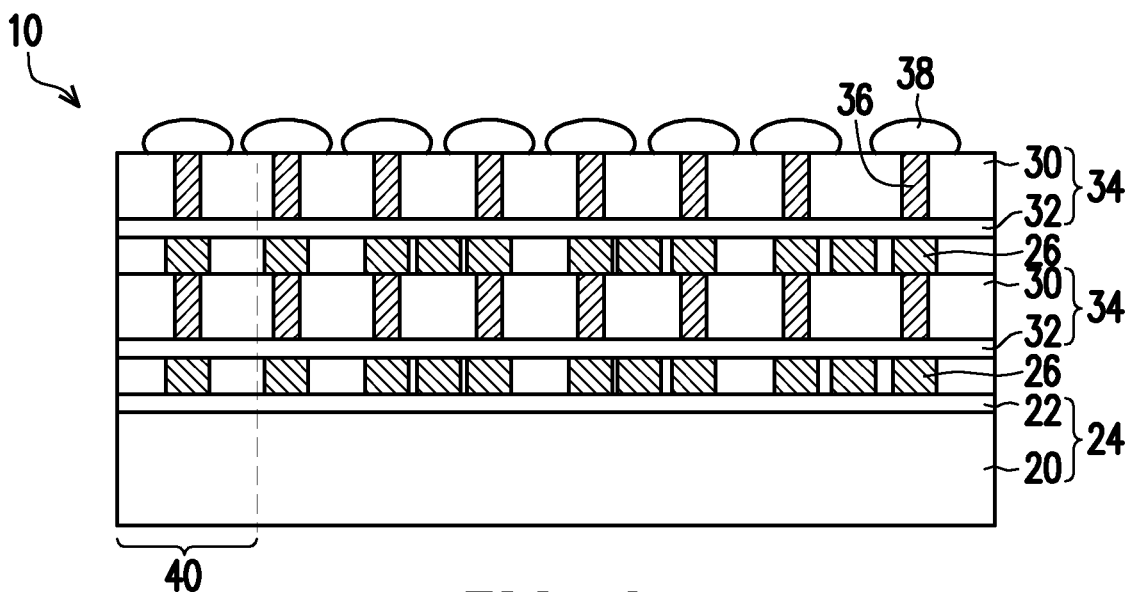
FIG. 2 is a drawing, schematically illustrating a cross-sectional stack structure of 3D semiconductor device with an interface, according to an embodiment of the invention.

FIG. 2 is a drawing, schematically illustrating a cross-sectional stack structure of 3D semiconductor device with an interface, according to an embodiment of the invention. Referring to FIG. 2, Based on the 3D package structure, in an embodiment, the 3D semiconductor device 10 may also include an interface region 40, where an interface in each circuit chip 24, 34 is formed at the interface region 40. The interface may link the circuit chip 24, serving as the master chip, to all of the circuit chips 34, which are serving as the slave chips. The communication between the circuit chip 24 and the circuit chips 34 may go through the interface at the interface region 40.

The circuit of the interface implemented within the interface region 40 would be described in detail later. As also noted, in an embodiment, multiple interface regions 40 as actually needed may be formed in the circuit chips, not limiting to single interface region.

Figure 3:
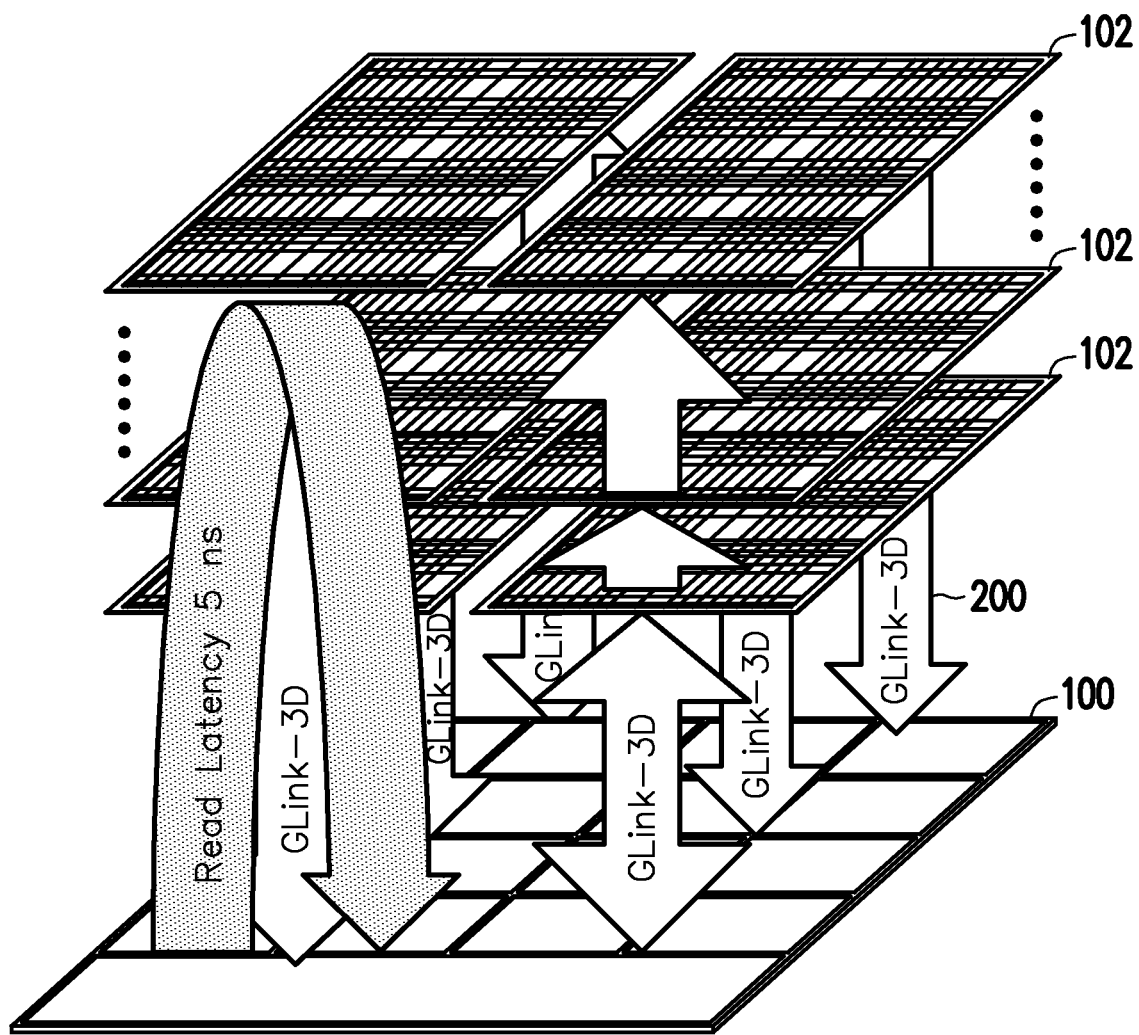
FIG. 3 is a drawing, schematically illustrating a perspective stack structure of 3D semiconductor device with the communication mechanism of the interface, according to an embodiment of the invention.

FIG. 3 is a drawing, schematically illustrating a perspective stack structure of 3D semiconductor device with the communication mechanism of the interface, according to an embodiment of the invention.

Referring to FIG. 3, as viewed in 3D stack structure in operation of the interface, a master chip 100, such as a processor chip, is included as a base chip in the semiconductor device. Multiple slave chips 102, such as SRAM chips, are stacked over the master chip 100. The master chip 100 includes a master interface and each slave chip includes a slave interface. The master interface and the slave interfaces form as an interface 200, which may also be referred as Glink-3D. The master chip 100 and the slave chips 102 are linked by the interface 200 to communication with the information/data/signal.

In an operation as an example, the master chip 100 of processor has a command to access the data stored in the slave chips 102 of SRAM chips. Due to the interface as implemented, the read latency may be controlled to be about constant and small, such as 2 ns or 5 ns in the examples. A single clock is used in the interface to distribute to all the slave chips, the path length from the master chip 100 to each slave chip 102 is about the same and reliable. The latency can be adjusted to be about constant as predictable.

Figure 4:
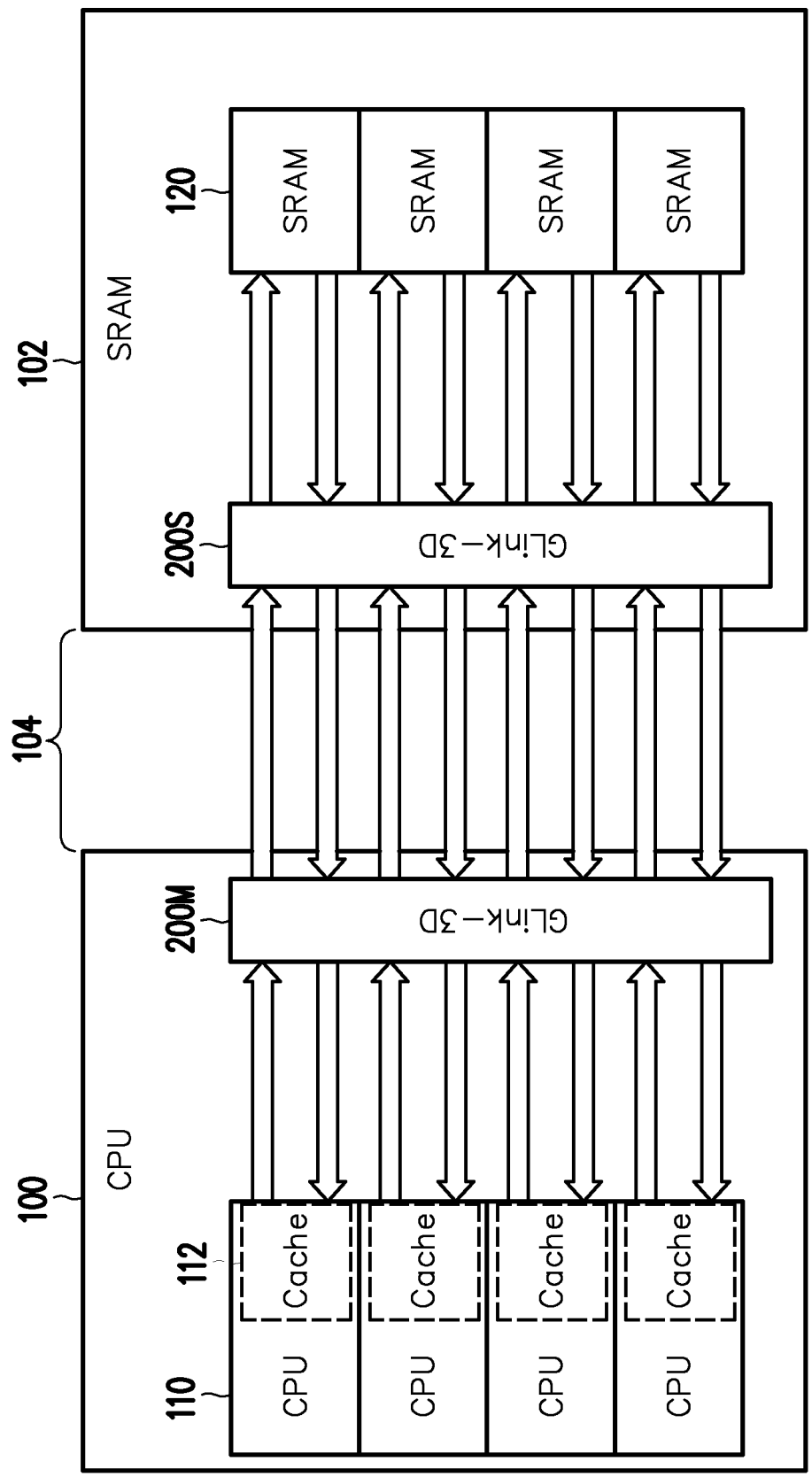
FIG. 4 is a drawing, schematically illustrating a communication mechanism of the interface between a master chip and a slave chip, according to an embodiment of the invention.

FIG. 4 is a drawing, schematically illustrating a communication mechanism of the interface between a master chip and a slave chip, according to an embodiment of the invention. Referring to FIG. 4, a communication mechanism between the master chip 100 with a master interface 200M and the slave chip 102 with a slave interface 200S through a bonding structure 104 in 3D package is described. The master interface 200M and the slave interface 200S form the interface 200 as stated in FIG. 3. Inside the master chip 100, the CPU blocks 110 with the cache blocks 112 in an example form a processor. The processor is connected to the master interface 200M to transmit or receive signals at the master interface 200M, as intended to communicate with the slave chip 102.

Inside of the slave chip 102, it also includes the SRAM blocks 120 and the slave interface 200S. The SRAM blocks 120 is connected to the slave interface 200S for communication with the master chip 100. IN communication the master interface 200M and the slave interface 200S are connected through the bonding structure 104. The bonding structure 104 may include the TSV with the hybrid bond pattern, depending on the packaging process. The connection is bi-way. The bond pattern may be corresponding to a data bus, generally. All signals are parallel transmitted or received. The clock rate may be 2.5 GHz in an example. The signal latency between the master chip 100 and the slave chip 102 through the interface of the master interface 200M and slave interface 200S is reliable and may be about 2 ns in one way as an example.

Figure 5:
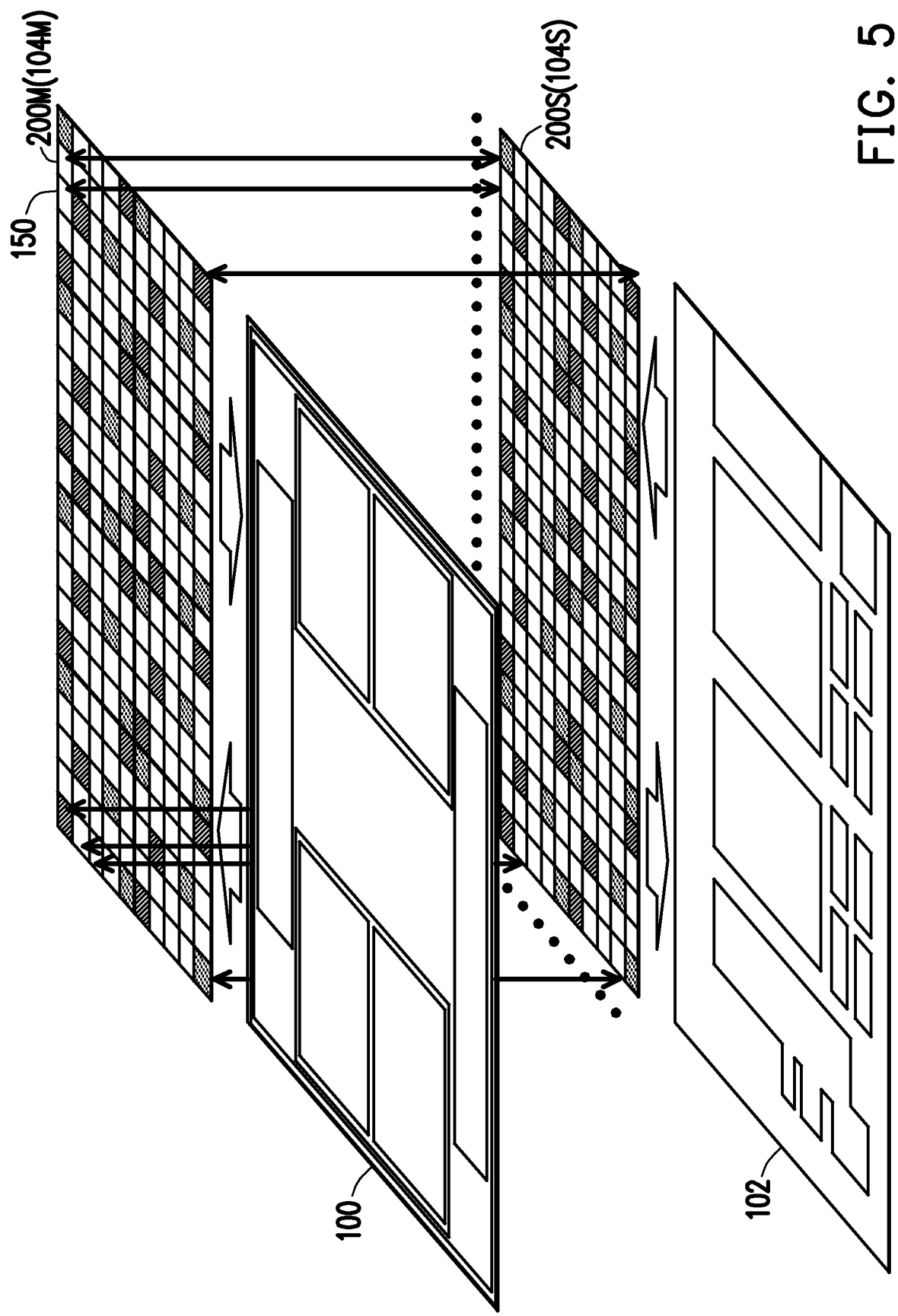
FIG. 5 is a drawing, schematically illustrating a 3D communication mechanism of the interface between a master chip and a slave chip, according to an embodiment of the invention.

FIG. 5 is a drawing, schematically illustrating a 3D communication mechanism of the interface between a master chip and a slave chip, according to an embodiment of the invention. Referring to FIG. 5, based on the operation mechanism as previously described, the master chip 100 and the slave chip 102 in 3D structure as an example is illustrated in better detail. The master chip 100, such as the processor, includes the master interface 200M, which including the bonding structure 104M. The bonding structure 104M in an example includes a bonds pattern, composed of a plurality of bonds in an example. As a result, depending on the data size of the bus, the bonds are formed as an array, in which one bonding tile 150 is corresponding to one group of binary data, such as 16-bit data with the voltage bond, clock bond, and other designated bonds. Multiple bonding tiles 150 form the whole bond pattern for the master interface 200M. As noted, the data from the processor is communicated in bi-direction with the master interface 200M.

Likewise, the slave chip 102 may include the SRAM and the slave interface 200S. The SRAM communicates with the slave interface 200S, and the slave interface 200S communicates with the master interface 200M through the connection of the bonding structure 104S, which is also composed of a plurality of bonds, each represented by one square unit, arranged in an array manner as a bond pattern. Likewise, the bond pattern is also divided into multiple bonding tiles 150. In the 3D packaging technology, the master interface 200M and the slave interface 200S are connected through the bonding structure 104M and the bonding structure 104S with the matched bond patterns. As a result, the master interface 200M and slave interface 200S are connected as a complete interface, based on the 3D packaging technology, to have communication between the master chip 100 and slave chip 102. As noted, multiple slave chips 102 are stacked on top of the master chip 100, in which the master interface 200M and the slave interfaces 200S are connected together in vertical direction.

Figure 6:
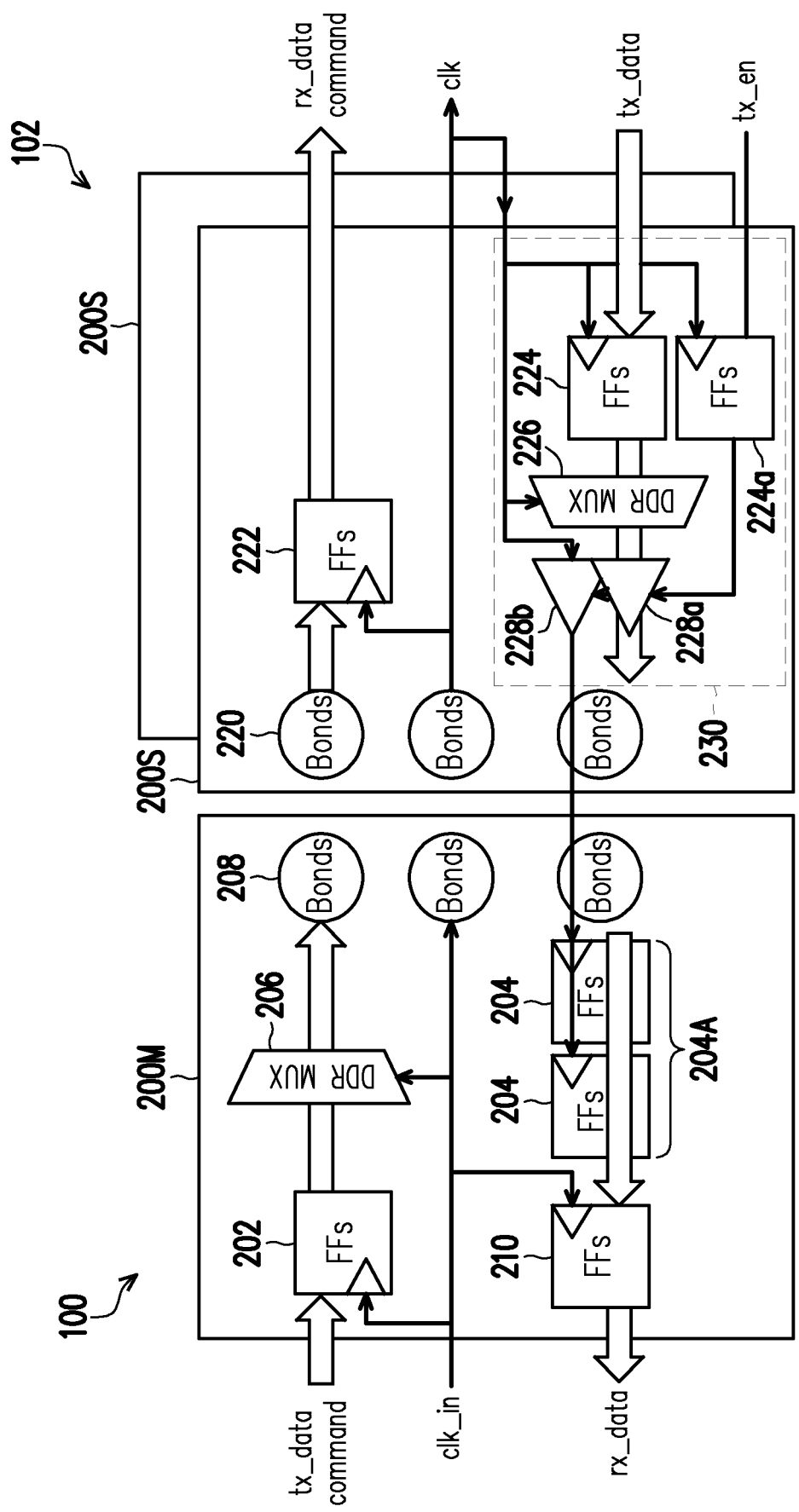
FIG. 6 is a drawing, schematically illustrating a circuit structure of the interface between a master chip and a slave chip, according to an embodiment of the invention.

The circuit for the master interface 200M and the slave interface 200S are described as follows. FIG. 6 is a drawing, schematically illustrating a circuit structure of the interface between a master chip and a slave chip, according to an embodiment of the invention.

Referring to FIG. 6, the master interface 200M of a master chip 100 and the slave interface 200S of a slave chip 102 are described with the circuit as implemented. As to the master interface 200M, it includes a flip-flop (FF) block 202 to receive a command as intended by the core circuit of the master chip 100. The command in an example as an input may include a cluster of data tx_data and/or command without specific limitation. The number of the flip-flop block 202 may be one unit (FF) or more unit (FFs) as actually need without limitation here. The command from the master chip 100 in an example may include command and the data cluster to be transmitted. The command may also include a selecting slave identification, which is used to select the slave chip 102 to perform the command from the master chip 100.

A multiplexer 206 receives the output of the flip-flop block 202. The multiplexer 206 in an example is a double data rate (DDR) type in accordance with the input data at the flip-flop block 202. The output of the multiplexer 206 is transmitted to the corresponding bonds of a bond pattern 208 in the master interface 200M.

As noted, the single clock, clk, is provided through the master interface 200M and the slave interface 200S into the slave chip 102. The flip-flop block 202 and the multiplexer 206 are controlled in timing by the clock clk_in. In the master interface 200M, the flip-flop block 202 and the master multiplexer 206 form a transmitting path, so to transmit command to the slave chip 102.

The master interface 200M also includes a receiving path to receive the response from the slave chip 102 through the slave interface 200S and the master interface 200M with the corresponding bond portion of the bond pattern 208. A first-in-first-out (FIFO) block 204A receives the response from the slave interface 200S. The FIFO block 204A in an example include multiple flip-flop units 204. The output of the FIFO block 204A is provided to another flip-flop block 210 and then inwardly transmitted into the core of the master chip 100. The flip-flop block 210 is controlled in timing by the clock clk_in. The FIFO block 204A is controlled by the feedback clock from the slave chip 102 with an enable control corresponding to the response data from the slave chip 102.

In an example of read operation, the command of the master chip 100 is received by the flip-flop block 202 of the master interface 200M. The slave chip 102 as selected responds the data as requested to the FIFO block 204A of the master interface 200M.

In the slave interface 200S of the chip 102, the bond pattern 220 is corresponding to the bond pattern 208. The command of the master chip 100 is then received by a flip-flop block 222, which is also control the clock clk. The flip-flop block 222 in the slave interface 200S then further transmit the command, such as rx_data and/or command, inward to the SRAM of the slave chip 102. In an example, the master chip 100 sends a command to read data from the SRAM of the slave chip 102.

Then, the slave chip 102 provides the data cluster as requested from the master chip 100, also indicated by tx_data to the slave chip 102 in an example, into the circuit block 230. The circuit block 230 is also controlled by the clock clk and an enable signal, tx_en. The circuit block 230 includes a flip-flop block 224, an enable flip-flop block 224a, a slave multiplexer 226, and an output control block 228a, 228b.

The clock signal clk in each slave interface 200S for control is also provided to the third flip-flop block 222, the fourth flip-flop block 224, the slave multiplexer 226, the enable flip-flop block 224a, and the output control block 228b.

The flip-flop block 224 outputs the data to the slave multiplexer 226 and then the output control block 228a. The enable flip-flop block 224a receives an enable signal; tx_en and the clock signal clk and provides a control signal to control the output control block 228a. Then the data as provided by the slave chip 102 is transmitted to the master chip 100 through a bond portion of the bond pattern 220.

To have the proper timing control of the clock signal clk to respond to the master chip 100, another output control block 228b also receives the original clock clk and control by the enable signal from the enable flip-flop block 224a.

The data output from the slave interface 200S is then received by the FIFO block 204A in the master interface 200M. To the master interface 200M, the data rx_data are the response from the slave chip 102 with respect to the command, such as command.

In an embodiment, there are a number of the slave chips 102 stacked over the master chip 100. The command from the master chip 100 is sent to all of the slave chips 102. In this situation, the command of the master chip 100 also includes a selecting slave identification, which is used to select the slave chip 102 to perform the command from the master chip 100. The slave interface 200S also include the capability to recognize the selecting slave identification code. Each of the slave interfaces 200S has its own identification code. The one of the slave interfaces 200S matching to the selecting slave identification code would be activated to respond the command from the master chip 100 at the time slot allocated by the master command. The interference between the slave chips may be effectively avoided.

Figure 7:
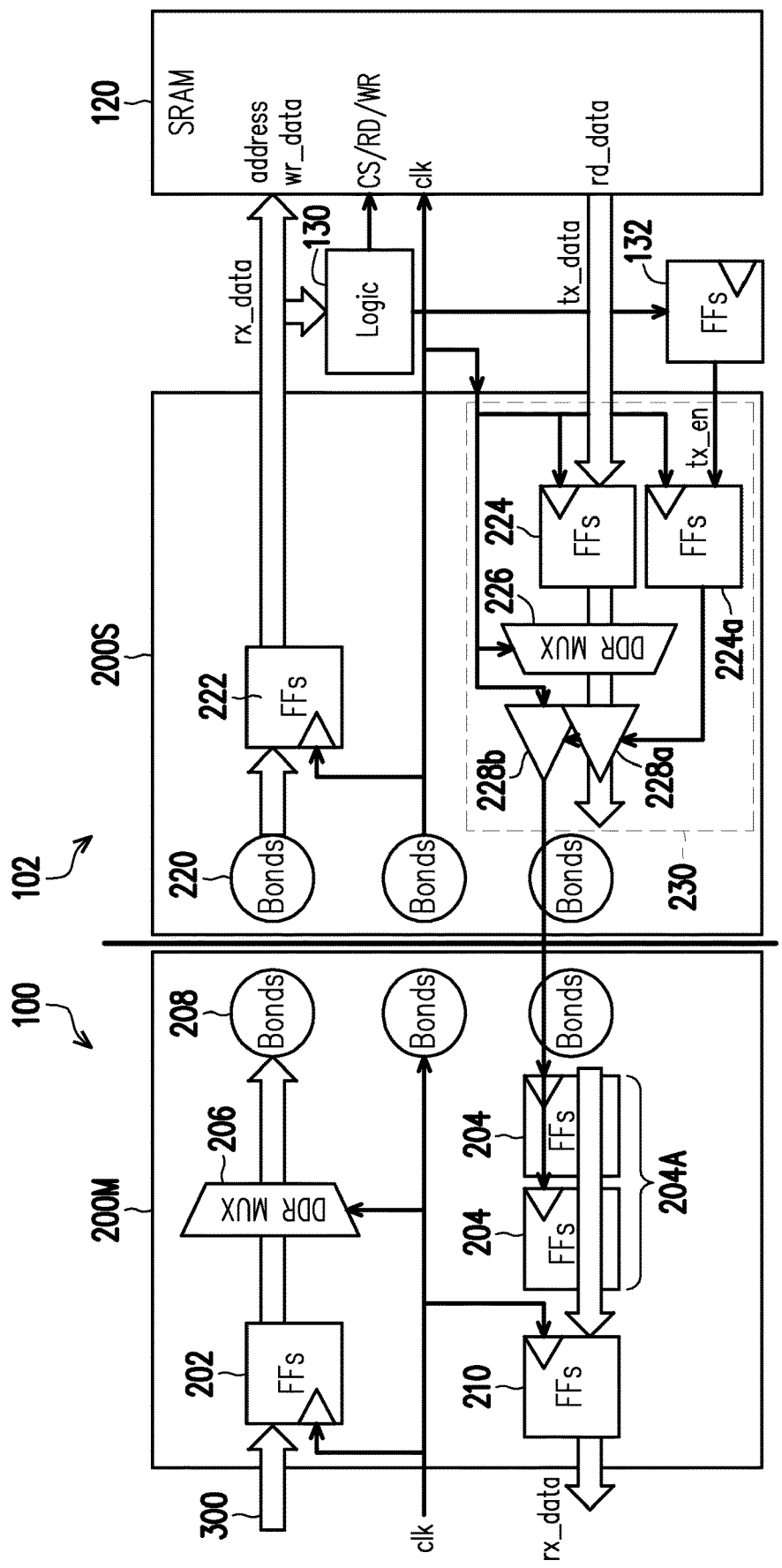
FIG. 7 is a drawing, schematically illustrating a circuit structure of the interface between a master chip and a slave chip, according to an embodiment of the invention.

FIG. 7 is a drawing, schematically illustrating a circuit structure of the interface between a master chip and a slave chip, further according to an embodiment of the invention. Referring to FIG. 7, the connection between the slave interface 200S and the SRAM 120 in an example is further described.

The command 300 may include command, address, write data and the selecting slave identification, in an example. The data rx_data from the flip-flop block 222 of the slave interface 200S is output to the SRAM 120. However, the slave interface 200S may further include a logic circuit 130 and a fifth flip-flop block 132. The logic circuit 130 also receives the command, such as the data rx_data, outputting from the third flip-flop block 222 to determine a type signal of command/read_data/write_data (CS/RD/WR) and also produce a preliminary enable signal to the fifth flip-flop block 132, the fifth flip-flop block 132 accordingly output the enable signal to the enable flip-flop block 224a. The SRAM 120 receives the type signal of CS/RD/WR to respond the command from the master chip 100. Once the slave chip 102, such as the SRAM 120 finishes the command, a result such as the data rd_data for reading command is responded to the slave interface 200S as the input data tx_data for the slave interface 200S.

As further noted, in the structure of the invention including the interface in connecting to multiple slave chips 102, such as 16 slave chips, the write command and the read command may be overlapping and then executed simultaneously. The size of the data bus may have 256 bits in addition with some reserved bits. The master bond pattern 208 and slave bond pattern 220 have the number of bonds as needed in the master interface 200M and the slave interface 200S to transmit the data signals, which are grouped into multiple bonding tiles 150S, 150M as shown in next FIG. 8. In addition, the bonding tile 170 shown in FIG. 8 may also be included for transmitting the other control signals for actual operation.

Since the 3D packaging technology allows multiple chips to stack up, in which the bonds located at the face surface of the chip. However, the TSV structure is included to extend the bonds at the face surface to the back surface of the chip. To the stacked chips, two chips may be electric connected at the bond patters by face-to-face manner or face-to-back manner as the choices.

Figure 8:
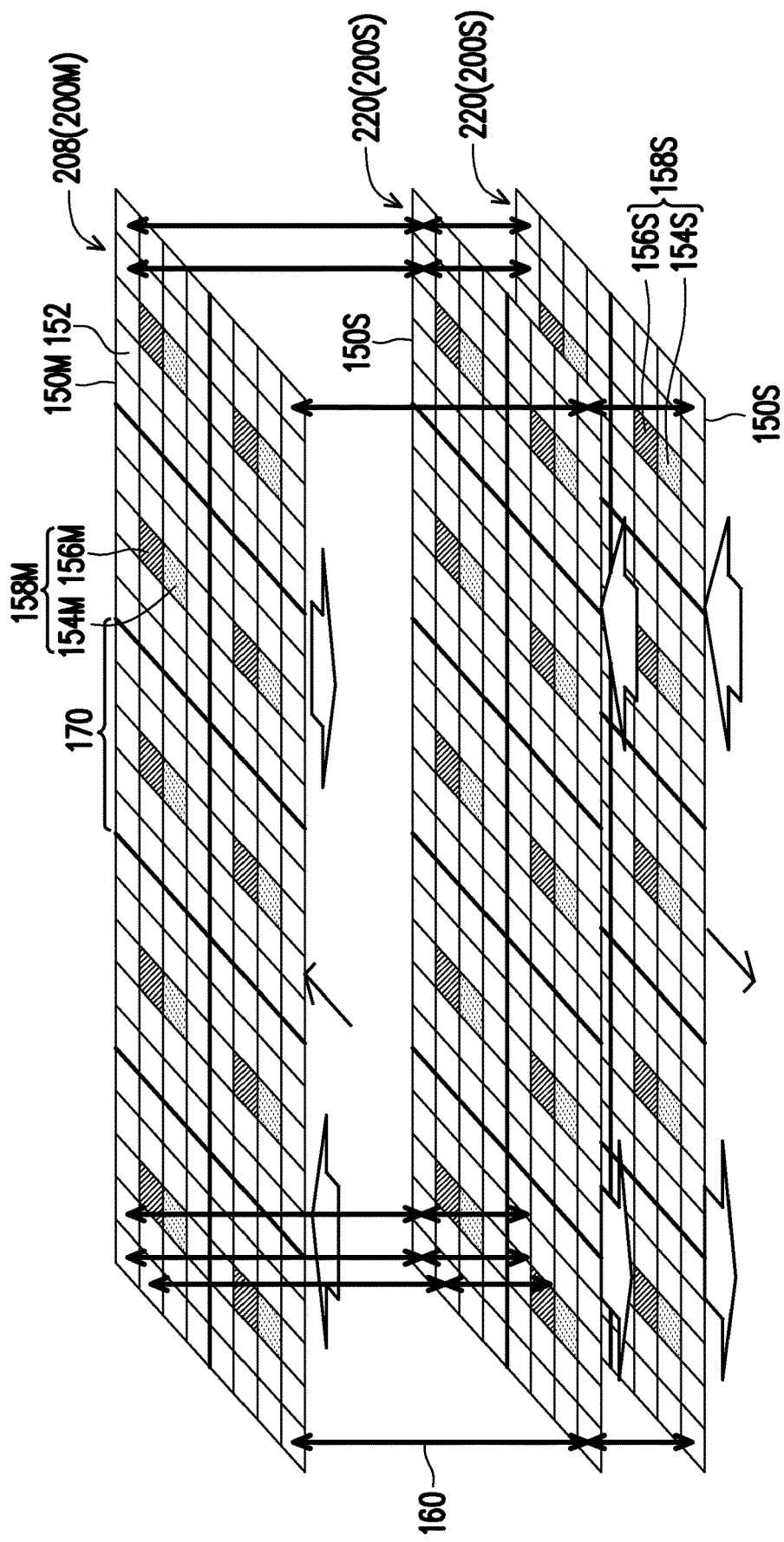
FIG. 8 is a drawing, schematically illustrating the communication mechanism of the interface with bond pattern, according to an embodiment of the invention.

FIG. 8 is a drawing, schematically illustrating the communication mechanism of the interface with bond pattern, according to an embodiment of the invention. Referring to FIG. 8 and also referring to FIG. 5, the master bond pattern 208 of the master interface 200M includes a plurality of bonds 152. The bonds 152 in an embodiment may be grouped into multiple bonding tiles 150 seen in FIG. 5, in which the bonding tiles 150 belonging to the master interface 200M may also be referred as the bonding tile 150M while bonding tiles 150 belonging to the slave interface 200S may also be referred as the bonding tile 150S. Taking the bonding tile 150M as an example for descriptions, one bond tile 150M include a group of bonds, which is used to transmit a set of data signals, voltage signals, data parity signal and control signals in an example. The data signals in an example includes 16-bit data but is not limited to. The voltage bonds 154M, 156M may include system high voltage such VDD and the ground voltage such VSS. The bonds with constant function transmitting voltage signals, data parity signal and control signals may be referred to the functional bonds 158M, which include the voltage bonds 154M, 156M and are located at a central row in one bond tile 150M. In other words, one bond tile 150S may include a central row of bonds with the functional bonds 158S, which include the voltage bonds 154S, 156S. The data bonds 152 for transmitting data signals may divided into two parts of data rows, which in geometric location are symmetric with respect to the central row. The detail would be described later.

Depending on the operation of the interface, the bonding tile 170 may be also included for transmitting or receiving various control signals as needed in operation between the master chip 100 and the slave chip 102, in which the clock signal as indicated by thin arrows may be included in the bonding tile 170 for transmitting or receiving, in an embodiment. The arrow 160 represents the vertical connection at the bond pattern 208 of the master interface 200M and the bond pattern 220 of the slave interfaces 200S for communication between the master chip 100 and the slave chip 102 through the bond pattern 208 in the master interface 200M and the bond pattern 220 in the slave interface 200S. To the master interface 200M, the inward thick arrow represents the command issued from the master device, such as processor. The commands are transmitted vertically downward to the slave device through bond pattern 208 of the master interface 200M and the bond pattern 220 of the slave interface 200S. The output thick arrow represents the command is transmitted to the slave device, such as the SRAM. The slave interface 200S then receives the data from the slave device according to the command and then transmit to the master interface 200M, which is provide the data to master device as indicated by thick arrow with the output direction.

The bond tile 150M, 150S are configured to have the central row and the data rows in two parts at two sides of the central row in symmetric locations. This configuration of the bonds may allow to easily package the master chip with the multiple slave chips by the ways of face-to-face, face-to-back and back-to-back, in which bonds of the bond pattern 208, 220 may be flipped or not flipped to adapt the ways of face-to-face, face-to-back, or back-to-back.

In the forgoing description, the interface is well set up. The slave chip 102 may further include a managing circuit to manage the address for the slave chips. The address for the slave chips may be set up by one slave chip after one slave chip. The total number of the slave chips may also be detected. Since the operation command from the master chips is passed one slave chip after one slave chip, the master chip does not need to have high driving capability. In an example, the master chip may be designed to just pass the operation command for the zeroth level of the slave chips. However, it has been sufficient for the current slave chip to just drive the next slave chip. As a result, one slave chip after one slave chip may be activated until the target slave chip is recognized. Further, the manage command would stop passing to the rest slave chips. The number of the slave chip may be more flexibly to increase.

Figure 9A:
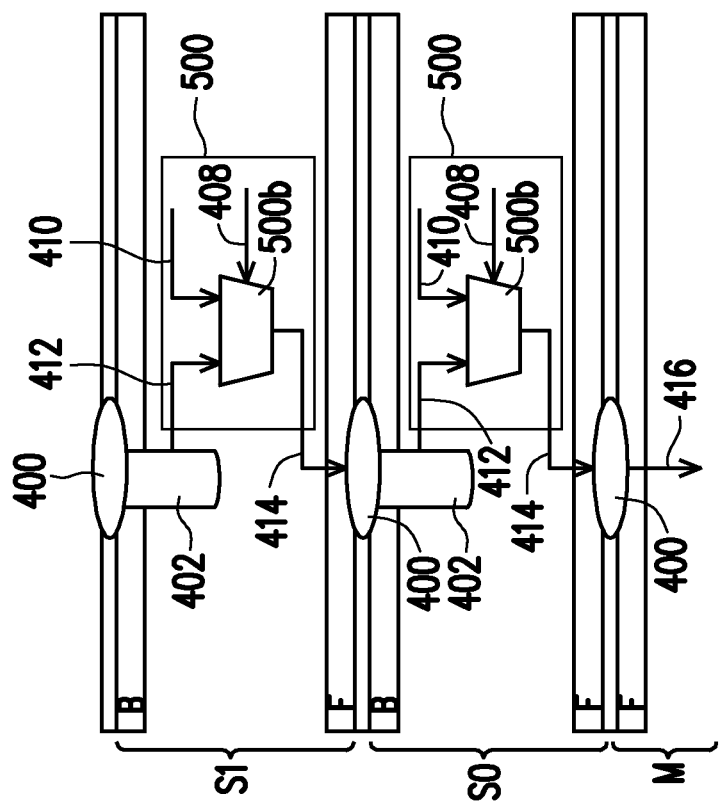
FIG. 9A is a drawing, schematically illustrating a managing mechanism in the initialization stage to address the slave chips through the interface, according to an embodiment of the invention.

9A is a drawing, schematically illustrating a managing mechanism in the initialization stage to address the slave chips through the interface, according to an embodiment of the invention. Referring to FIG. 9A, the slave chips S0, S1 may be stacked by a structure of face-to-face, face-to-back, or back-to-back, as the face side is indicated by F and the back side is indicated by B. The bonds 400 with the TSV 402 are involved in the master/slave interfaces to stack up the chips as foregoing descriptions. The number of slaver chips S0, S1 are two as taken for example but the invention is not limited to the number of the slave chips. The signal master chip M is taken as the example to communicate with the slave chips S0, S1.

In an embodiment, each of the slave chips S0, S1 includes a managing circuit 500. The managing circuit 500 also includes the comparing circuit 500a. The master chip M may issue an operation command 404, which in an embodiment includes a slave setting address in an initialization stage or a slave target address in actual operation, in an embodiment. The operation command 404 is passed to the slave chip S0, which is also the zeroth level of the slave chips, through the bonds 400 of the interface.

In operation, all the slave chips S0, S1 may be counted and set with the assigned address in the initialization stage. After then, in actual operation, the slave chips S0, S1 may respond the data as requested by the master chip M according to the actual operation command or just pass the command to the next slave chip until the target slave chip is reached. In addition, the command would stop pass the command to the next slave chip.

The managing mechanism at the initialization stage is described first. During the initialization stage, the master chip M may issue the operation command 404 by a sequence of slave setting address 406 with increment by one for each time issued by the master chip M in the initialization stage. The slave setting address 406 of the operation command 404 is received by the managing circuit 500 of the slave chip S0 in an example at the zeroth level. If the slave chip S0's address is not set yet it adopts the slave setting address 406 of the operation command 404 as its setting address. The slave setting address 406 may start from 0 up to a certain number by incrementing one for each time. The total number of the slave chips may be found as well at the end of the initialization stage. The slave setting address 406 in an embodiment is "0" for the first time and "1" for the next time with incremental of 1, and then is "2", "3",...., and so on. If setting address of the slave chip S0 is already set it may pass the address setting address 407 to the next one of the slave chip S0 according to the enable signal 408, which indicates that S0's address was already set.

Figure 9B:
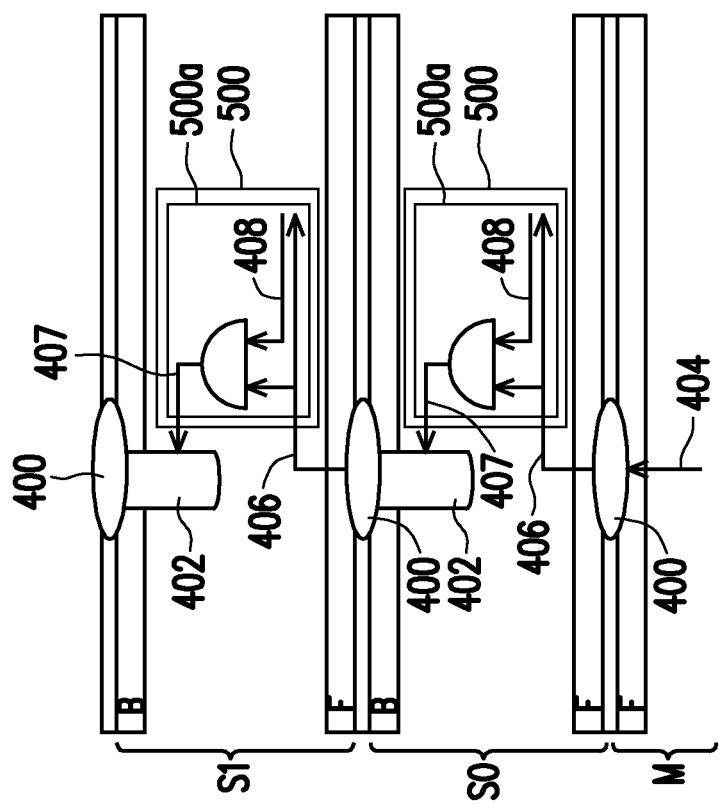
FIG. 9B is a drawing, schematically illustrating a managing mechanism in the initialization stage to respond to the master device through the interface, according to an embodiment of the invention.

FIG. 9B is a drawing, schematically illustrating a managing mechanism in the initialization stage to respond to the master device through the interface, according to an embodiment of the invention. Referring to FIG. 9B, in the initialization stage, the master chip M may need to count the slave chips as actually stacked over the master chip M. The managing circuit 500 also includes a multiplexing circuit 500b to pass the signal back to the master chip M. In the initialization stage, the managing circuit 500 may respond a response data 410 to the master chip M to at least make sure the current one of the slave chips is existing there. The response 414 after the multiplexing circuit 500b is passed, according to the enable signal 408, to the master chip M as the response data 416 through the bonds 400 of the interface.

Two cases are then subsequently expected. In a first case, a next slave chip S1 may still need to be set with address. The second case is that the current slave chip is the last one of the slave chips as stacked over and the total number of the slave chips would be determined.

To the first case, in the embodiment, the master chip M knows the slave chip S1 is still stacked over the slave chip S0 and then issue the next slave setting address by "1", which incrementing by one from "0". With the mechanism as foregoing description, the slave setting address 407 of "1" is greater than or not equal to the address of the slave chip S0 being already set as "0", and then the comparing circuit 500a is just passing the slave setting address 407 of "1" to the next slave chip S1 as the slave setting address 406 with respect to the slave chip S1. The address of the slave chip S0 is not set because the address has been set. The comparison and the responding mechanism for each slave chip S0, S1 is the same.

As a result, the response from the slave chip S1 is received by the master chip M. The master chip M in an example issues the slave setting address 406 with content of "2". Since the slave setting address 406 with content of "2" is greater than or not equal to the slave setting address 406 of "0" for the slave chip S0 and the slave setting address 406 of "1" for the slave chip S1, the slave setting address 406 with content of "2" in the slave chip S1 without setting the address of the slave chip S1 but try to pass to the bond 400 at the top. In the embodiment, there is no further slave chip is stacked over the slave chip S1. No response will be received by the master chip M. Then, the master chip M as the second case knows that the slave chip S1 in the embodiment is the last one. Then, the number of the slave chips S0, S1 is determined. Also and, the addresses for the slave chip S0 and the slave chip S1 are set by incrementing by one. Here, the incremental amount is not necessary to be one and can be 2, 3 or other incremental values depending on the actual design.

Further to note, the incremental address as assigned to the slave chips is just an example. Other mechanism to assign the address of the slave chip may be taken depending on the detecting mechanism as taken. However, the address command is passed one slave chip after one slave chip without need to pass the address command to all of the slave chips at the same time. In other words, the master chip does not need to issue the address command with high driving capability to reach all or the maximum number of the slave chips at the same time. In the invention, it has been sufficient for the current slave chip to just drive the next slave chip. Then, the number of the slave chips is more flexible, not limited the driving capability of the master chip.

Figure 10B:
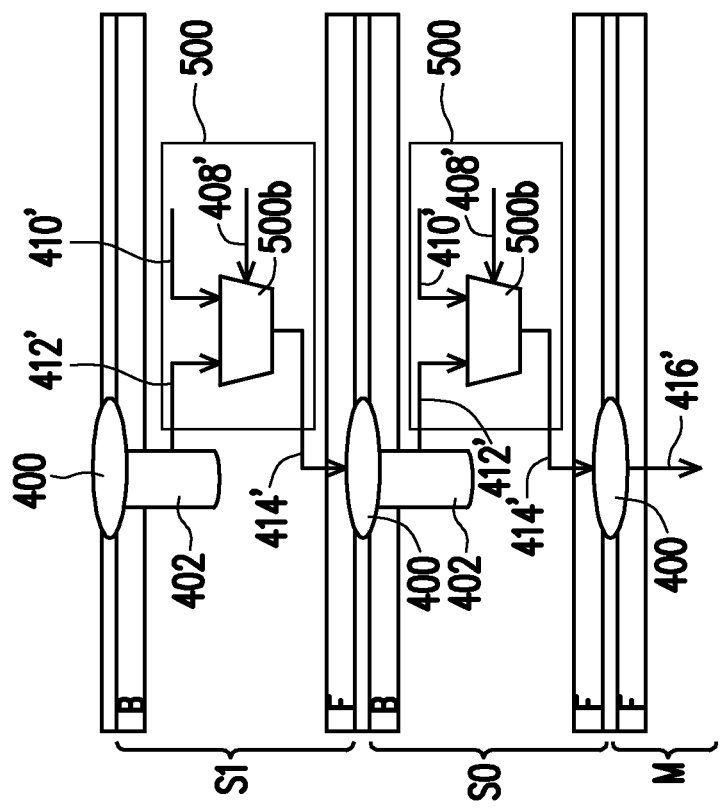
FIG. 10B is a drawing, schematically illustrating a managing mechanism in the operation stage to respond to the master device through the interface, according to an embodiment of the invention.
Figure 10A:
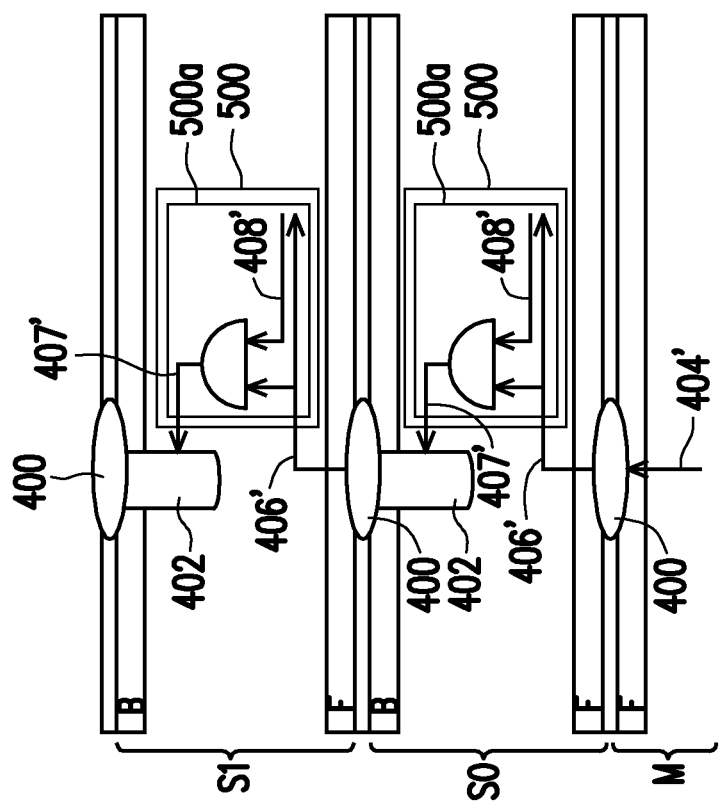
FIG. 10A is a drawing, schematically illustrating a managing mechanism in the operation stage to address the slave chips through the interface, according to an embodiment of the invention.

Once the initialization stage is finished, all the slave chips have been assigned with the ID address and the total number of the slave chips are also known by the master chip M. The master chip can reach to the target slave chip also based on the managing circuit 500. FIG. 10A is a drawing, schematically illustrating a managing mechanism in the operation stage to set the slave chips with address through the interface, according to an embodiment of the invention. FIG. 10B is a drawing, schematically illustrating a managing mechanism in the operation stage to respond to the master device through the interface, according to an embodiment of the invention.

Referring to FIG. 10A, when the master chips M issues the operation command 404' with the slave target address to access the target slave chip S0, the operation command 404' is passed to the slave chip S0 through the bonds 400. The comparing circuit 500a of the managing circuit 500 again compares the slave setting address 406' of the operation command 404' with the chip address of the slave chip S0 as assigned to, such as 0. The slave setting address 406' may be 0 or 1 in an example. If the slave setting address 406' is 0, then the comparing circuit 500a of the managing circuit 500 recognizes that the slave chip 0 is to be accessed by the master chip M, the slave setting address 406' stops passing to the next slave chip 1, according to the status of the enable signal 408'.

Referring to 10B, in an embodiment, the managing circuit 500 would activate the slave chip S0 to respond the response data 410' as requested by the master chip M. The response data 410' is passed by the multiplexing circuit 500b as the response 414' which is passed back to the master chip M through the bonds 400 as the response data 416' actually for the master chip M. Here, the enable signal 408' as a result from the comparing circuit 500a would control the multiplexing circuit 500b to pass the response data 410' but not the previous response 412', which actually is also none since the slave setting address 406' stops passing to the slave chip S1 and the slave setting address 407' is not produced to drive or active the slave chip S1. The slave chip S1 is blocked in this situation.

In further case that the slave setting address 406' is 1, the managing circuit 500 determines that the slave setting address 406' of 1 is greater than or not equal to the address of the slave chip of 0 for the slave chip S0, treated as the current one of the slave chips. The managing circuit 500 then just pass the slave setting address 407' to the next slave chip S1, treated as the next one of the slave chips. In this stage, the multiplexing circuit 500b of the managing circuit 500 in FIG. 10B is set to be ready for passing the response data 412', according to the enable signal 408'.

The slave chip S1 in this case would recognize that the slave chip S1 with respect to the operation command 404' is the target slave chip. The multiplexing circuit 500b of the managing circuit 500, according to the status of the enable signal 408' in the slave chip S1. The responds data 410' to the slave chip S0 is selected by the enable signal 408' in the multiplexing circuit 500b to pass back to the slave chip S0. The status of the enable signal 408' in the slave chip S0 controls the multiplexing circuit 500b in the slave chip S0 to select the response data 412' as the response data 414' for the master chip M. In other words, the multiplexing circuit 500b according to the enable signal 408' would select the response data 412' as previously passed from the slave chip S1 or the response data 410' as currently prepared in the slave chip S0 to pass back toward the master chip M.

In this kind of mechanism, the slave chips are driven one after one, in which all the slave chips are not activated all the time. In this case of the embodiment, the slave chips behind the target slave chip are not necessary to be activated.

According to the foregoing description, all of the slave chips may not be activated in once of access operation. The slave chips are activated up to the target slave chip. The signal may be passed chip by chip. The signal bus may be not globally going through the whole slave chips but passing chip by chip.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device with an interface, comprising:
    a master device, including a master interface; and
    a plurality of slave devices stacked on the master device one after one as a three-dimension (3D) stack, wherein each of the slave devices includes a slave interface and a managing circuit, the master interface and the slave interfaces form the interface for passing signals in communication between the master device and the slave devices,
    wherein the managing circuit of a current one of the slave devices drives a next one of the slave devices through the interface,
    wherein an operation command received at the current one of the slave devices is just passed to the next one of the slave devices through the interface,
    wherein a response from the current one of the slave devices is passed back to the master device through the interface.

2. The semiconductor device as recited in claim 1, wherein during an initialization stage the operation command including a slave setting address in an increment sequence is issued by the master device to set a slave address to each of the slave devices.

3. The semiconductor device as recited in claim 2,
    wherein the managing circuit sets the slave setting address of the current one of the slave devices and issues the response to the master device through the interface when an address of the current one of the slave devices is not set yet,
    wherein the managing circuit of the current one of the slave devices passes the slave setting address to the next one of the slave devices when the address of the current one of the slave devices is already set.

4. The semiconductor device as recited in claim 3, wherein the master device determines a number of the slave devices as stacked on the master device when no response to a command of the slave setting address being incremental from the slave devices is received by the master device.

5. The semiconductor device as recited in claim 3, wherein the managing circuit comprises a comparing circuit to compare the slave setting devices with the slave address as set to the current one of the slave devices,
    wherein the managing circuit passes the slave setting address to the next one of the slave devices when the slave setting address is not equal to the slave address of the current one of the slave devices;
    wherein the managing circuit sets the slave setting address as the slave address of the current one of the slave devices.

6. The semiconductor device as recited in claim 1, wherein during an operation stage the operation command including a slave target address is issued by the master device to reach to a target one of the slave devices and the managing circuit compares the slave target address with slave address of the current slave device.

7. The semiconductor device as recited in claim 6,
    wherein the managing circuit passes the slave target address to the next one of the slave devices when the slave target address is not equal to the slave address of the current one of the slave devices;
    wherein the managing circuit stops passing the slave target address when the slave target address is equal to the slave address of the current one of the slave devices.

8. The semiconductor device as recited in claim 7, wherein each of the managing circuit comprises a multiplexing circuit under control to pass a response data from the current one of the slave devices or just to pass the response data from previous one of the slave devices.

9. A managing method of a semiconductor device with an interface, the semiconductor device including a master device and a plurality of slave devices stacked on the master device one after one as a three-dimension (3D) stack, the managing method comprising:
configuring the master device to have a master interface; and
configuring each of the slave devices to have a slave interface and a managing circuit, the master interface and the slave interfaces form the interface for passing signals in communication between the master device and the slave devices,
wherein the managing circuit of a current one of the slave devices drives a next one of the slave devices through the interface,
wherein an operation command received at the current one of the slave devices is just passed to the next one of the slave devices through the interface,
wherein a response from the current one of the slave devices is passed back to the master device through the interface.

10. The managing method as recited in claim 9, wherein during an initialization stage the operation command including a slave setting address in an increment sequence is issued by the master device to set a slave address to each of the slave devices.

11. The managing method as recited in claim 10, further configuring the managing circuit to set the slave setting address of the current one of the slave devices and issue the response to the master device through the interface when an address of the current one of the slave devices is not set yet,
configuring the managing circuit of the current one of the slave devices to pass the slave setting address to the next one of the slave devices passes when the address of the current one of the slave devices is already set.

12. The managing method as recited in claim 11, wherein the master device determines a number of the slave devices as stacked on the master device when no response to a command of the slave setting address being incremental from the slave devices is received by the master device.

13. The managing method as recited in claim 11, further configuring the managing circuit to have a comparing circuit to compare the slave setting devices with the slave address as set to the current one of the slave devices,
wherein the managing circuit passes the slave setting address to the next one of the slave devices when the slave setting address is not equal to the slave address of the current one of the slave devices;
wherein the managing circuit sets the slave setting address as the slave address of the current one of the slave devices when the slave address is not set yet.

14. The managing method as recited in claim 9, wherein during an operation stage the operation command including a slave target address is issued by the master device to get to a target one of the slave devices and the managing circuit compares the slave target address with slave addresses of the slave devices.

15. The managing method as recited in claim 14, further configuring the managing circuit to pass the slave target address to the next one of the slave devices when the slave target address is not equal to the slave address of the current one of the slave devices;
configuring the managing circuit to stop passing the slave target address when the slave target address is equal to the slave address of the current one of the slave devices.

16. The managing method as recited in claim 15, wherein each of the managing circuits is configured to comprise a multiplexing circuit under control to pass a response data from the current one of the slave devices or just pass the response data from the previous one of the slave devices.

* * * * *